United States Patent [19]

Van Yperen

[11] Patent Number: 5,402,787
[45] Date of Patent: Apr. 4, 1995

[54] METHOD AND APPARATUS FOR MAGNETIC RESONANCE IMAGING

[75] Inventor: Gerrit H. Van Yperen, Eindhoven, Netherlands

[73] Assignee: U.S. Philips Corporation, Tarrytown, N.Y.

[21] Appl. No.: 68,809

[22] Filed: May 27, 1993

[30] Foreign Application Priority Data

May 27, 1992 [EP] European Pat. Off. ............ 92201513

[51] Int. Cl.$^6$ .............................................. A61B 5/055
[52] U.S. Cl. .................... 128/653.2; 324/309
[58] Field of Search .......................... 128/653.2, 653.1; 324/309

[56] References Cited

U.S. PATENT DOCUMENTS

| | | | |
|---|---|---|---|
| 4,570,119 | 2/1986 | Wehrli et al. | 324/309 |
| 4,599,565 | 7/1986 | Hoenninger, III et al. | 324/309 |
| 4,774,466 | 9/1988 | Satin | 324/309 |
| 4,818,940 | 4/1989 | Henning et al. | 324/309 |
| 4,908,578 | 3/1990 | Van Liere | 324/309 |
| 4,965,520 | 10/1990 | Sakamoto | 324/309 |
| 5,023,553 | 6/1991 | Sano et al. | 324/309 |
| 5,229,717 | 7/1993 | Hinks | 324/309 |
| 5,280,244 | 1/1994 | Hinks | 324/309 |
| 5,281,916 | 1/1994 | Hinks et al. | 324/309 |
| 5,285,158 | 2/1994 | Mistretta et al. | 324/309 |

FOREIGN PATENT DOCUMENTS

0175184 8/1985 European Pat. Off. .

*Primary Examiner*—Lee S. Cohen
*Assistant Examiner*—Brian L. Casler
*Attorney, Agent, or Firm*—Jack D. Slobod

[57] ABSTRACT

In a magnetic resonance imaging method multiple refocusing RF-pulses (22-26) are applied and spin-echo signals (62-66) obtained following an excitation RF-pulse (21). Sequences are executed twice, in time-reversed order. Both measurements are used in the reconstruction of an image. This results in images in which artefacts and blurring due to $T_2$-decay is reduced.

4 Claims, 4 Drawing Sheets

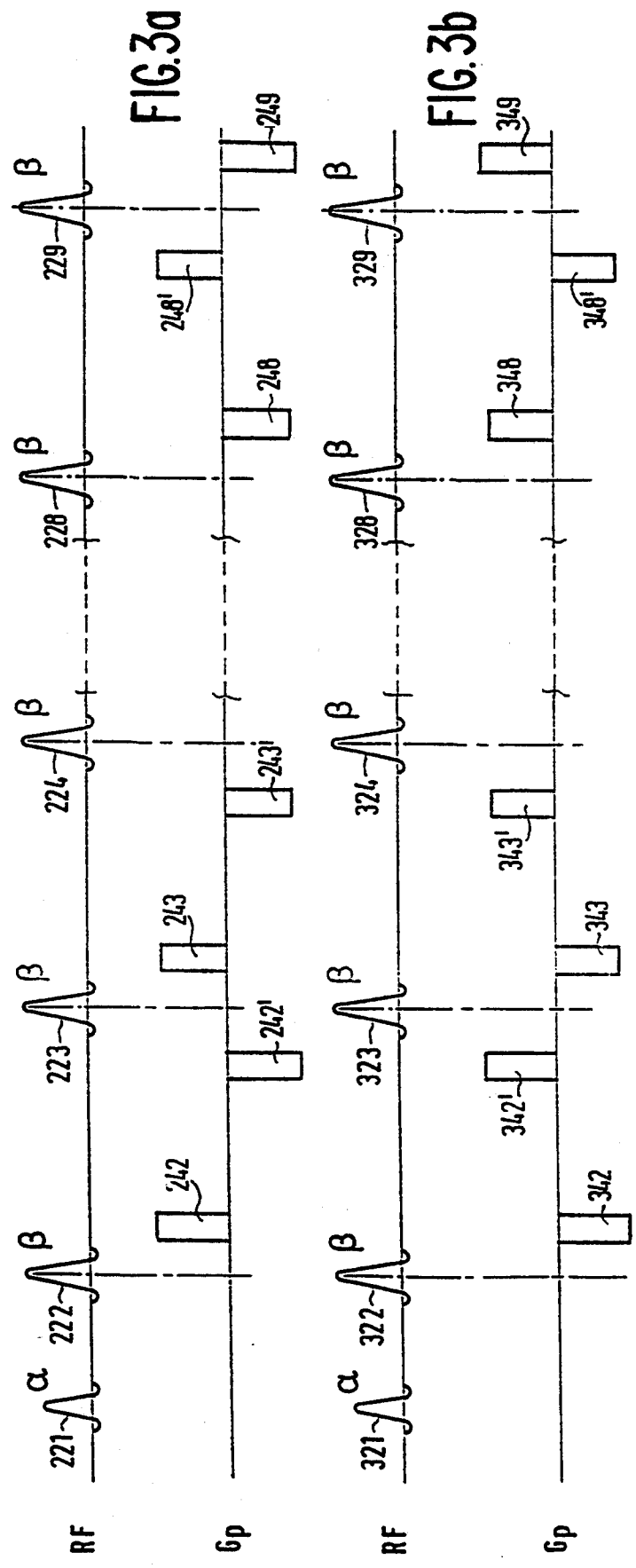

METHOD AND APPARATUS FOR MAGNETIC RESONANCE IMAGING

BACKGROUND OF THE INVENTION

1. Field of the Invention

The invention relates to a method for magnetic resonance imaging of a body placed in a stationary and substantially homogeneous main magnetic field, which a method includes the application of an excitation radio-frequency pulse (RF-pulse) for excitation of nuclear dipole moments in at least a portion of the body, the application of a plurality of refocusing RF-pulses following said excitation RF-pulse and of gradient magnetic fields for generating magnetic resonance signals a comprising position dependent information and the measurement of magnetic resonance signals which follow at least a number of the refocusing RF-pulses. The invention also relates to an apparatus for magnetic resonance imaging using such a method. Such a sequence of RF-pulses is, for example, a CPMG-sequence (Carr-Purcell-Meiboom-Gill sequence) which generates multiple nuclear magnetic resonance echo signals (NMR-signals) following the refocusing RF-pulses.

2. Description of the Related Art

Such a method for imaging is known from EP-A 0 175 184, which corresponds to U.S. Pat. No. 4,818,940. As indicated in that document, a selection of a portion of the body is made by the application of a gradient magnetic field during the application of the excitation RF-pulse. This results in the excitation of a slice of the body in which slice the Larmor frequency of a selected nucleus type in the magnetic field corresponds to the frequency of the RF-pulse. The slice selection gradient magnetic field is also applied during application of the refocusing RF-pulses. For position determination of the magnetic resonance signals, a gradient magnetic field with the gradient in a first direction within the slice is applied in the interval between the refocusing RF-pulses and the measurements of the nuclear magnetic resonance (NMR) signals for phase encoding of the NMR-signals. During the measurement a second gradient magnetic field, with its gradient in a second direction within the slice and perpendicular to the first direction provides frequency encoding of the NMR-signals.

In case a volume is selected as the excited portion of the body, a slice selection gradient may be absent during the RF-pulses. In addition to first and second gradient magnetic fields, a third gradient magnetic field with its gradient perpendicular to the first and second gradient magnetic fields is applied in between the RF-pulses and the measurements of the NMR-signals for additional phase encoding in that direction.

A disadvantage of such a sequence is that, due to spin-spin relaxation, the $T_2$-decay, the magnitude of the spin-echo signals decreases. So, contributions from the same region of the body portion are measured as signals of different size. In the resulting image, this leads to undesirable image errors such as blurring and ringing artefacts. As the total measured signal contains contributions of substances with different $T_2$ value, removal of the artefacts by weighting the signals with a time dependent weight is not possible.

SUMMARY OF THE INVENTION

It is, inter alia, an object of the invention to provide a magnetic resonance method in accordance to the introductory paragraph in which artefacts due to the $T_2$-decay are significantly reduced. Thereto, the method according to the invention is characterised in that, for a substantial fraction of magnetic resonance signals equivalent magnetic resonant signals are generated with identical gradient magnetic field settings, the sum of the time intervals between the excitation RF-pulse and the occurrence of magnetic resonant signals following identical gradient magnetic field settings being substantially equal for each gradient magnetic field setting.

Several magnetic resonance signals with identical position information encoded into them are measured and the sum of the time intervals from the excitation RF-pulse to each of the measurements is equal for all sets of measurements with identical position encoding. As all measurements enter into the image reconstruction process, the effects of $T_2$-decay upon the resulting image are significantly reduced.

A preferred embodiment is characterised in that an equivalent sequence is executed in which gradient magnetic fields are applied to the body for generating position dependent magnetic resonance signals in time-reversed order for time-reversed detection of equivalent magnetic resonance signals. Time reversed detection of the position encoded magnetic resonance signals provides a simple way in which the invented method can be used, ensuring the equal total time condition.

In an embodiment of the magnetic resonance method the magnetic resonance signals are measured in a plurality of sequences, each sequence comprising an excitation RF-pulse, a plurality of refocusing RF-pulses alternating with measurements of magnetic resonance signals and switched gradient magnetic fields for phase encoding. In this embodiment the position dependency of the magnetic resonance signal is imposed as phase encoding of the precessing nuclear dipole moments. In accordance with the invention this embodiment is characterised in that in the equivalent sequences the switched gradient magnetic fields are applied to the body for applying phase encoding values in time-reversed order and the same phase encoding value occurring in one sequence in an odd rank number and in the equivalent sequence in an even rank number. Due to imperfections in the RF-pulses and switched gradient magnetic fields, a deviation may occur in the phase encoding values. The refocusing RF-pulses cause the phase deviation to be reflected, thereby causing, in first order, the deviation within a sequence to act as an alternation with the rank number. In this embodiment the measurements are supplemented by providing at each phase encoding value an additional measurement in which the deviation has the opposite sign. The effects of the deviation in the phase encoding values is thereby mitigated. A more detailed description of this effect can be found in the simultaneously filed U.S. patent application Ser. No. . . . 08/068,817, filed May 27, 1993.

The invention also relates to an apparatus for performing such a method. Such an apparatus for magnetic resonance imaging of a body placed in a stationary and substantially homogeneous main magnetic field comprises means for establishing the main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for applying an excitation radio-frequency pulse (R-F-pulse) for excitation of nuclear dipole moments in at least a portion of the body, applying a plurality of refocusing RF-pulses following said excitation RF-pulse and gradient magnetic fields for generating position dependent magnetic resonance signals in the excited portion, measurement of magnetic resonance signals which follow at least a number of said refocusing RF-pulses. According to the invention it is further arranged for the apparatus is further arranged for generating equivalent magnetic resonant signals for a substantial fraction of magnetic resonance signals, the equivalent signals being generated with identical gradient magnetic field settings, the sum of the time intervals between the excitation RF-pulse and the occurrence of magnetic resonant signals following identical gradient magnetic field settings being substantially equal for each gradient magnetic field setting.

BRIEF DESCRIPTION OF THE DRAWING

These, and other more detailed aspects of the invention will now be elucidated by way of example with reference to the accompanying drawings wherein:

FIGS. 3a and 3b show a sequence and an equivalent sequence of RF-pulses and gradient magnetic fields according to the invention, respectively;

DETAILED DESCRIPTION OF THE PREFERRED EMBODIMENTS

Figure 1:
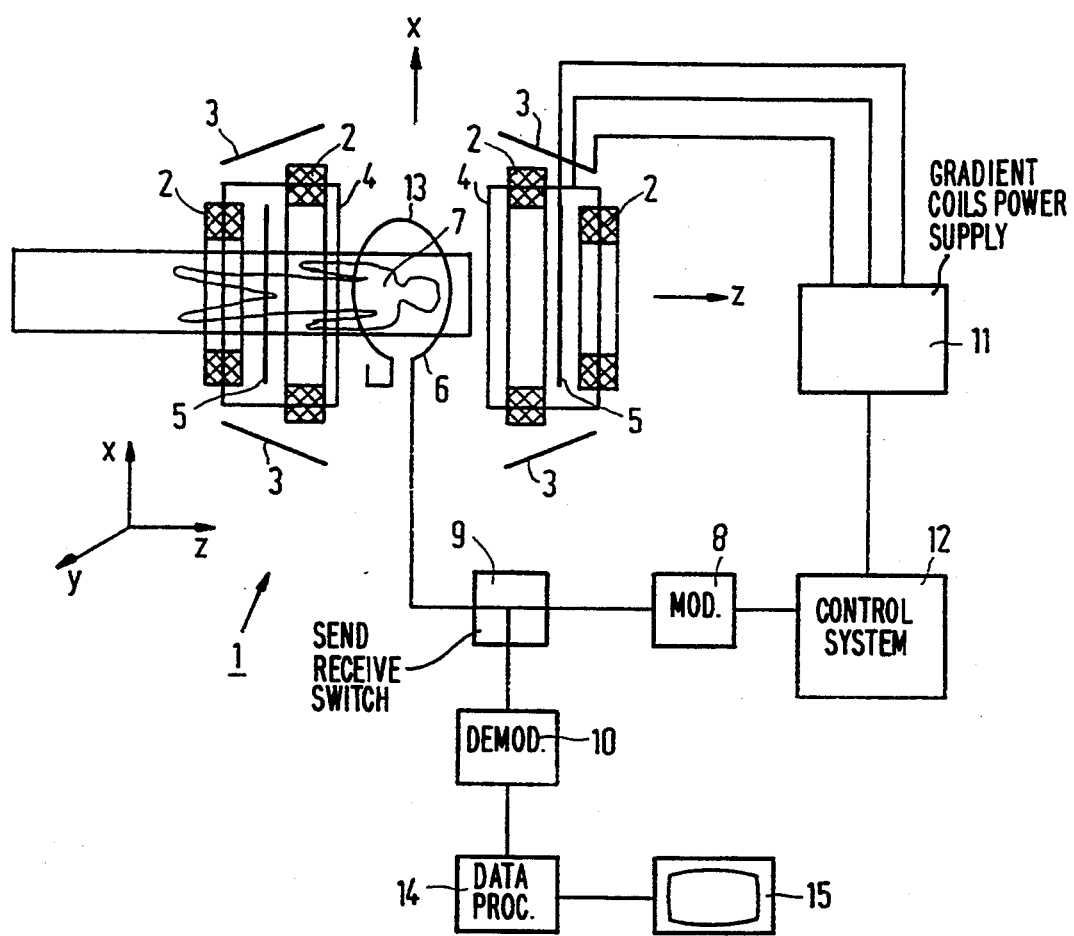
FIG. 1 shows diagrammatically a magnetic resonance imaging apparatus, suitable for the method according to the invention.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises emitting means 6 for emitting radio-frequency pulses (RF-pulses) to an object or body 7, the radiation means being coupled to modulating means 8 for generating and modulating of the RF-pulses. Also provided are means for receiving the NMR-signals, these means can be identical to the emitting means 6 or be separate. If the emitting and receiving means are identical, as shown in the figure, a send-receive switch 9 is arranged to separate the received signals from the pulses to be emitted. The received NMR-signals are input to receiving and demodulating means 10. The modulating means 8 and the power supply 11 for the gradient coils 3, 4 and 5 are steered by a control system 12 to generate a predetermined sequence of RF-pulses and gradient field pulses. The demodulation means is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the nuclei, thereby bringing the nuclear dipole moments in an exited state and re-orienting the magnetisation $M_O$. By applying the proper RF-pulses, a rotation of the macroscopic magnetisation is obtained, the angle of rotation is called the flip-angle. The introduction of variations in the magnetic field by applying gradient magnetic fields influences the behaviour of the magnetisation locally. After the application of RF-pulses, the changed magnetisation will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
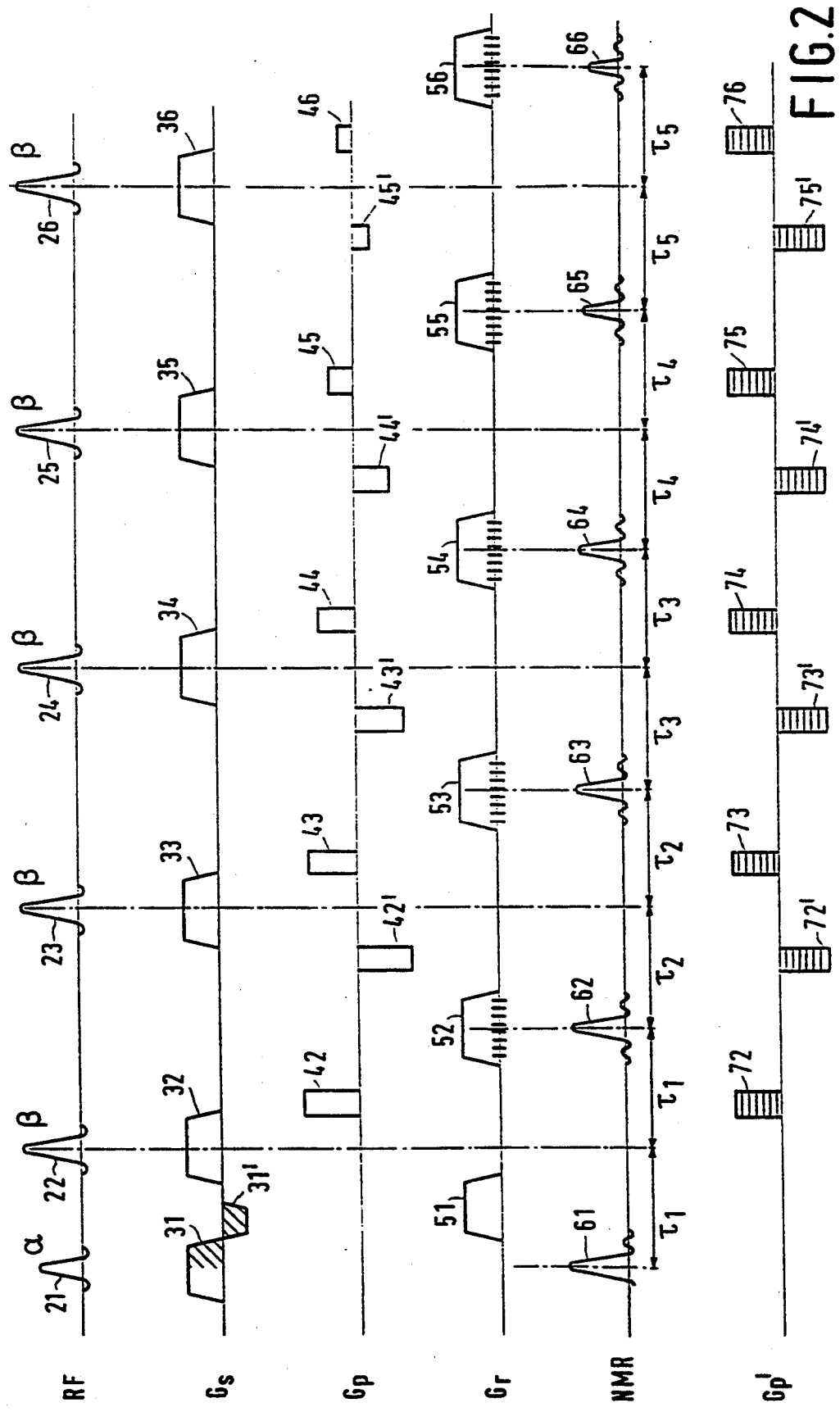
FIG. 2 shows a sequence of an excitation RF-pulse, a plurality of refocusing RF-pulses, gradient magnetic fields and the occurrence of NMR-signals as a function of time.

FIG. 2 shows a known sequence of RF-pulses and magnetic field gradients for obtaining multiple spin-echo NMR-signals following a single excitation pulse. In the upper line RF the start of the sequence is indicated with an excitation RF-pulse 21 having a flip-angle $\alpha$, followed after an interval $\tau_1$ by a first refocusing RF-pulse 22 having a flip-angle $\beta$. Normally, the values of $\alpha$ and $\beta$ are 90° and 180°, respectively. Following the excitation RF-pulse 21, a free induction decay (FID) nuclear magnetic resonance signal 61, indicated on the lower line NMR, is generated which dies out rapidly when the individual precessing nuclear magnetic dipole moments lose phase coherence due to local variations in the magnetic field. The refocusing RF-pulse 22 reverses the direction of these individual magnetic dipole moments without affecting the local magnetic field. Consequently, the dephasing is reversed into a rephasing resulting after an equal interval $\tau_1$ in the occurrence of a NMR spin-echo signal 62. After the spin-echo signal 62 the dipole moments dephase again. Repetition of refocusing RF-pulses 23, 24, 25 and 26 cause subsequent reversals of the dephasing and the repeated occurrence of NMR spin-echo signals 63, 64, 65 and 66. Due to non-compensated effects, mainly spin-spin relaxation with a time constant $T_2$, the magnitude of subsequent echoes decreases in time. The interval lengths $\tau_2$, $\tau_3$, $\tau_4$ and $\tau_5$ between an NMR-signal and the next refocusing RF-pulse are normally chosen to be equal in length.

The effect of the RF-pulses is made selective to a portion of the body 7 by applying, simultaneously with the RF-pulses a slice selection gradient, which is indicated on the second line $G_s$ in the figure. As indicated by 31 the slice selection gradient is first applied during the excitation RF-pulse 21. The dephasing caused by this first gradient 31 is compensated by an opposite gradient 31'. Also during the application of the refocusing RF-pulses 22–26 slice selection gradients 32–36 are switched on. For position determination within the selected slice, phase encoding gradient pulses 42, 43, 44, 45 and 46 with the gradient direction within the selected slice, indicated on the third line $G_p$, are applied in the interval between the RF-pulse and the NMR spin-echo signals 62, 63, 64, 65 and 66. In addition, frequency encoding or read gradients 52, 53, 54, 55 and 56, indicated on the fourth line $G_r$, having a gradient direction also within the selected slice but perpendicular to the gradient direction of the phase encoding field, are switched on during the occurrence of the spin-echo signals. The dephasing effects of the phase encoding gradients is removed after the occurrence of the spin-echo signals by applying further gradient field pulses 42', 43', 44', 45' with the same time-integrated size but with the gradient direction opposite compared to the preceding gradient pulses 42, 43, 44, 45, respectively. The dephasing effect of the read gradients 52, 53, 54, 55 and 56 is compensated for by the refocusing RF-pulses. An initial dephasing gradient 51 preceding the first refocusing RF-pulse 22 is then necessary, this initial dephasing gradient 51 has half the time-integrated size of the read gradients 52, 53, 54, 55 and 56.

Alternatively, not a slice but a volume portion of the body can be selected. In that case the slice selection gradient $G_s$ may be absent or adopted for selection of a thick section of the body. In addition to the mentioned gradient fields, a second phase encoding gradient magnetic field $G_p$, is applied having a gradient direction perpendicular to the gradient directions of the first phase encoding field $G_p$ and the read gradient field $G_r$. Like the first phase encoding field $G_p$, this second gradient encoding field is applied as a series of gradient pulses 72, 73, 74, 75, 76, following the RF-pulses and compensating gradient pulses 72', 73', 74', 75', following the NMR-signals. As indicated by horizontal lines in gradient pulses 72–76 and 72'–76', the size of the second phase encoding gradient pulses are kept constant when the first phase encoding gradient pulses are varied. Alternatively, the first phase encoding gradient pulses 42–46 and 42'–45' may be kept constant and the second phase encoding gradient pulses be varied within a sequence. Hereinafter, the embodiments of the invention are described in the two-dimensional slice selection mode. However, extension to three-dimensional volume imaging by the application of a second phase encoding field is possible as well.

After acquisition of the NMR-signals, for example 256 spin-echo signals each with a different phase encoding value and each sampled 256 times, the total set of measurements is convened into an image by means of a Fourier transform (FT). As a consequence of the previously mentioned T$_2$-decay the NMR-signals occurring later in the sequence have a lower amplitude than the earlier signals. As a signal contains contributions of regions with different T$_2$ values, compensation by increasing the relative weight of the later signals in not possible. The T$_2$-decay causes blurring and ringing artefacts in the resulting image.

Figure 4A:
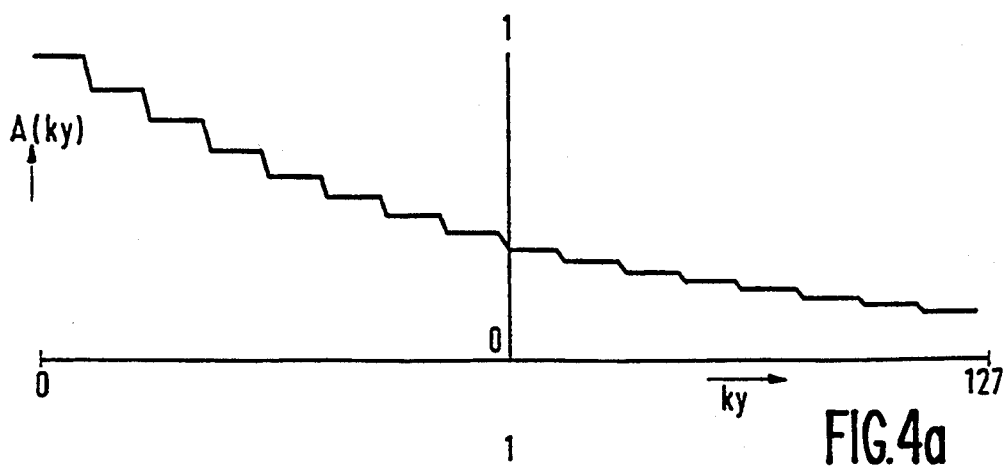
FIGS. 4a and 4b show the relative $T_2$-decay of a single sequence and of two sequences combined according to the invention.
Figure 4B:
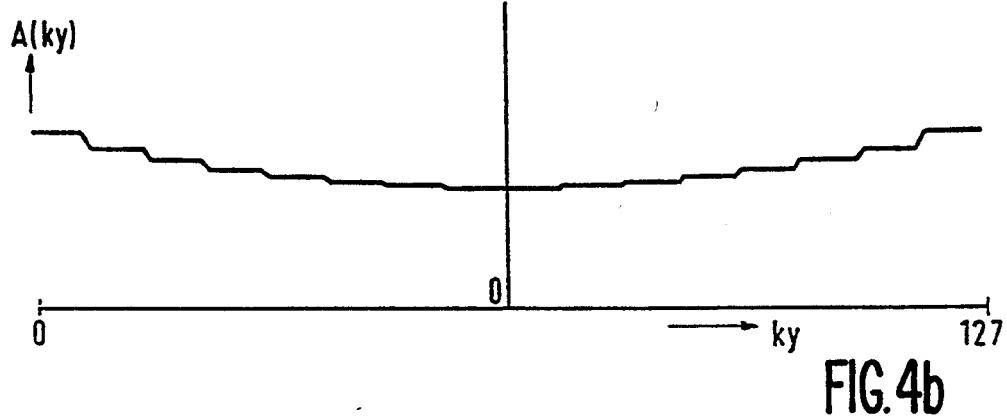

In FIGS. 3a and 3b, two sequences of RF-pulses and gradient magnetic field pulses for obtaining NMR-signals according to the invention are shown. With the exception of the phase encoding gradient $G_p$, the sequences are identical with the sequence shown in FIG. 2 and only the $G_p$ gradients and the RF-pulses are shown. The first and last few RF-pulses and accompanying gradient pulses are indicated only. The sequence of phase encoding gradient pulses 242, 243, . . . , 248 and 249, shown in FIG. 3a is linearly decreasing. The sequence of FIG. 3b has linearly increasing phase encoding gradient pulses 342, 343, . . . , 348 and 349, the phase encoding in the two chains being time reversed copies of each other. After executing both sequences there are two measurements for each phase encoding value. The sum of the time interval between excitation RF-pulse 221 and the measurement with a given phase encoding value in the first sequence, with the time interval between excitation RF-pulse 321 and the measurement with the same phase encoding value in the second sequence is the same for each phase encoding value. In FIGS. 4a and 4b the relative T$_2$-decay A(T$_2$) of a single sequence and of two combined time-reversed sequences is shown as a function of the phase encoding value $k_y$, for 128 different phase encoding values determined in a series of interleaved sequences. As expected, the combined time reversed sequence shows much less amplitude variation. Using both measurements in the image reconstruction procedure reduces the blurring and artefacts due to T$_2$-decay considerably.

As mentioned hereinbefore, imperfections in the RF-pulses and the switched gradient magnetic fields, the latter mainly due to eddy currents, cause deviations or offsets in the phases of precession of the nuclear spins. Due to the refocusing RF-pulses the deviations, in first order, alternate with the spin-echo signals. If the two sequences of measurements for the same set of phase encoding values have an even number of refocusing RF-pulses, for each phase encoding one of the two measurements follows an RF-pulse with an even and one with an odd rank number. As the phase deviation is in first order alternating with the rank number, the effect of the two measurements is that the errors largely cancel.

Figure 5A:
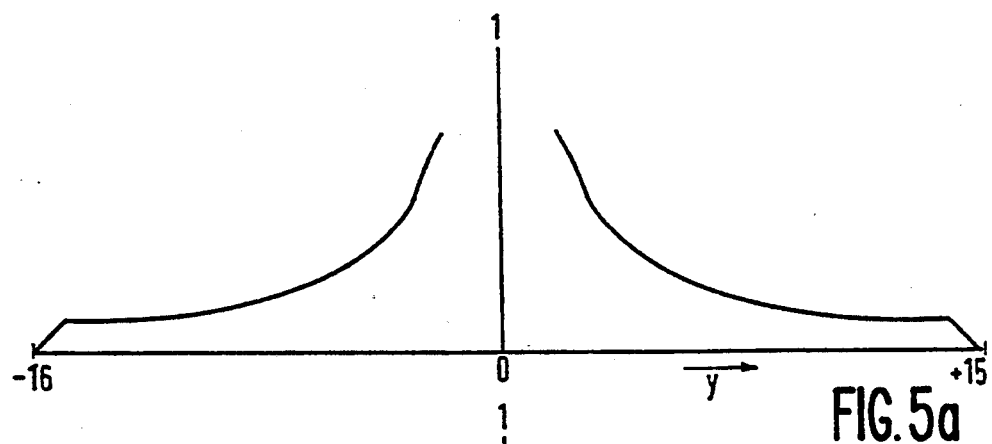
FIGS. 5a and 5b show the central part of the modulus of the point spread function for a single sequence and for two sequences combined according to the invention.
Figure 5B:
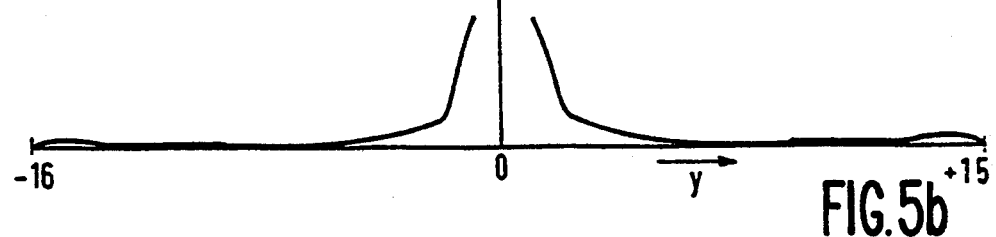

In FIGS. 5a and 5b the central part of the modulus of the point spread function (PSF(y)) is shown for a single set of measurements and for a combination of two sets, time-reversed relative to each other with an even number of phase encoding values. PSF(y) is mathematically the Fourier transform of a signal $e^{i\phi}$, in which $\phi(k_y)$ is the phase deviation, and indicates the contribution of a point in the body to the resulting image. The figure is determined with $\phi(k_y)$ alternating between $+20°$ and $-20°$. As can be seen, the combination of two time-reversed sequences leads to a considerable narrower PSF(y). This indicates that artefacts and blurring due to the phase deviations and T$_2$-decay are largely removed in the resulting image. Investigation of the real and imaginary parts, not shown, of PSF(y) reveals that the imaginary part of PSF(y) is strongly reduced.

I claim:

1. A method for magnetic resonance imaging of a body placed in a stationary and substantially homogeneous main magnetic field, the method comprising:
   applying sequences, each comprising an excitation
   RF-pulse for excitation of nuclear dipole moments in at least a portion of the body, followed by a plurality of refocusing RF-pulses and gradient magnetic field phase encoding pulses following said refocusing RF-pulses for generating magnetic resonance signals following said gradient magnetic field phase encoding pulses at respective time intervals after said excitation RF-pulse, said gradient magnetic field phase encoding pulses comprising groups of pulses, the gradient magnetic field phase encoding pulses of each group of pulses having a same integral value which is different for each group, and measuring the generated magnetic resonance signals which follow at least a number of said gradient magnetic field phase encoding pulses, wherein the measured magnetic resonance signals comprise groups of at least two equivalent magnetic resonance signals which are generated following respective gradient magnetic field phase encoding pulses of a corresponding group of phase encoding pulses having a same integral value, and for each group of at least two measured equivalent magnetic resonance signals, said time intervals at which the at least two measured equivalent magnetic resonance signals occur after the excitation RF-pulse are different, and wherein the groups of equivalent magnetic resonance signals have substantially equal sums of said time intervals.

2. A method as claimed in claim 1, wherein said gradient magnetic field phase encoding pulses comprise a first series of pulses followed by a second series of pulses having the same integral values as the first series of pulses but in time-reversed order.

3. A method as claimed in claim 1, wherein for each group of at least two measured equivalent magnetic resonance signals, one measured equivalent magnetic resonance signal is generated in one of said sequences following a gradient magnetic field pulse having an integral value of odd rank number position in said one of said sequences and another of said measured equivalent magnetic resonance signal is generated in another of said sequences following a gradient magnetic field pulse having an integral value of even rank number position in said another of said sequences.

4. Apparatus for magnetic resonance imaging of a body placed in a stationary and substantially homogeneous main magnetic field comprising means for establishing the main magnetic field, generating means for generating gradient magnetic fields superimposed upon the main magnetic field, means for radiating RF-pulses towards a body placed in the main magnetic field, measuring means for receiving and sampling magnetic resonance signals generated by sequences of RF-pulses generated in the body, and control means for controlling the generating means and the measuring means, said control means comprising means for controlling the generating means to apply sequences, each comprising an excitation RF-pulse for excitation of nuclear dipole moments in at least a portion of the body, followed by a plurality of refocusing RF-pulses and gradient magnetic field phase encoding pulses following said refocusing RF-pulses for generating magnetic resonance signals following said gradient magnetic field phase encoding pulses at respective time intervals after the excitation RF-pulse, said gradient magnetic field phase encoding pulses comprising groups of pulses, the gradient magnetic field phase encoding pulses of each group of pulses having a same integral value which is different for each group, and for controlling the measuring means to measure the generated magnetic resonance signals which follow at least a number of said gradient magnetic field phase encoding pulses, wherein the measured magnetic resonance signals comprise groups of at least two equivalent magnetic resonance signals which are generated following respective gradient magnetic field phase encoding pulses of a corresponding group of phase encoding pulses having a same integral value, and for each group of at least two measured equivalent magnetic resonance signals, said time intervals at which the at least two measured equivalent magnetic resonance signals occur after the excitation RF-pulse are different, and wherein the groups of equivalent magnetic resonance signals have substantially equal sums of said time intervals.

* * * * *